(12) United States Patent  
Costa et al.

(10) Patent No.: US 9,077,312 B1  
(45) Date of Patent: Jul. 7, 2015

(54) HIGH REJECTION SURFACE ACOUSTIC WAVE FILTER

(71) Applicant: Resonant Inc., Santa Barbara, CA (US)

(72) Inventors: James R. Costa, Lompoc, CA (US); Kurt Raihn, Goleta, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 14/495,494

(22) Filed: Sep. 24, 2014

Related U.S. Application Data

(60) Provisional application No. 62/029,279, filed on Jul. 25, 2014.

(51) Int. Cl.
| | | |
|---|---|---|
| *H03H 9/72* | (2006.01) | |
| *H03H 9/64* | (2006.01) | |
| *H03H 9/02* | (2006.01) | |

(52) U.S. Cl.
CPC ............ *H03H 9/725* (2013.01); *H03H 9/02818* (2013.01); *H03H 9/0296* (2013.01); *H03H 9/6483* (2013.01); *H03H 9/6409* (2013.01)

(58) Field of Classification Search
CPC .......... H03H 9/02818; H03H 9/02842; H03H 9/02905; H03H 9/09; H03H 9/6483; H03H 9/725; H03H 9/0296; H03H 9/6409
USPC ........... 333/133, 193–196; 310/313 B, 313 D
See application file for complete search history.

(56) References Cited

U.S. PATENT DOCUMENTS

| | | | | |
|---|---|---|---|---|
| 4,647,881 | A | * | 3/1987 | Mitsutsuka .................... 333/194 |
| 5,287,036 | A | * | 2/1994 | Penunuri ................... 310/313 R |
| 5,396,199 | A | * | 3/1995 | Tera et al. ...................... 333/150 |
| 6,034,578 | A | * | 3/2000 | Fujita et al. .................... 333/193 |
| 7,385,468 | B2 | * | 6/2008 | Furusato et al. ............... 333/193 |
| 2004/0085161 | A1 | * | 5/2004 | Kushitani et al. ............. 333/195 |
| 2006/0214748 | A1 | | 9/2006 | Funami et al. |
| 2011/0084573 | A1 | * | 4/2011 | Yamaji et al. .................. 310/340 |

FOREIGN PATENT DOCUMENTS

| | | | | |
|---|---|---|---|---|
| JP | 6-232688 | * | 8/1994 | .................... 333/195 |
| JP | 7-154201 | * | 6/1995 | |

OTHER PUBLICATIONS

English language machine translation of JP 6-232688, published Aug. 19, 1994.*

* cited by examiner

*Primary Examiner* — Barbara Summons
(74) *Attorney, Agent, or Firm* — SoCal IP Law Group LLP; Steven C. Sereboff; John E. Gunther

(57) ABSTRACT

A filter includes two or more surface acoustic wave resonators formed on a surface of a substrate and at least one ground conductor formed on the surface of the substrate. At least a portion of an edge of the ground conductor is formed as a plurality of serrations.

20 Claims, 7 Drawing Sheets

HIGH REJECTION SURFACE ACOUSTIC WAVE FILTER

RELATED APPLICATION INFORMATION

This patent claims priority from Provisional Patent Application No. 62/029,279, filed Jul. 25, 2014, titled HIGH ISOLATION DUPLEXER, which is included by reference in its entirety.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to radio frequency filters using surface acoustic wave (SAW) resonators, and specifically to filters and duplexers incorporating SAW resonators to provide very high rejection or isolation in a predetermined frequency band.

2. Description of the Related Art

As shown in FIG. 1, a SAW resonator 100 may be formed by thin film conductor patterns formed on a surface of a substrate 105 made of a piezoelectric material such as quartz, lithium niobate, lithium tantalate, or lanthanum gallium silicate. A first inter-digital transducer (IDT) 110 may include a plurality of parallel conductors. A radio frequency or microwave signal applied to the first IDT 110 via an input terminal IN may generate an acoustic wave on the surface of the substrate 105. As shown in FIG. 1, the surface acoustic wave will propagate in the left-right direction. A second IDT 120 may convert the acoustic wave back into a radio frequency or microwave signal at an output terminal OUT. The conductors of the second IDT 120 may be interleaved with the conductors of the first IDT 110 as shown. In other SAW resonator configurations (not shown), the conductors forming the second IDT may be disposed on the surface of the substrate 105 adjacent to, or separated from, the conductors forming the first IDT.

The electrical coupling between the first IDT 110 and the second IDT 120 may be frequency-dependent. The electrical coupling between the first IDT 110 and the second IDT 120 typically exhibits both a resonance (where the impedance between the first and second IDTs is very high) and an anti-resonance (where the impedance between the first and second IDTs approaches zero). The frequencies of the resonance and the anti-resonance are determined primarily by the pitch and orientation of the interdigitated conductors, the choice of substrate material, and the crystallographic orientation of the substrate material.

Grating reflectors 130, 132 may be disposed on the substrate to confine most of the energy of the acoustic waves to the area of the substrate occupied by the first and second IDTs 110, 120. However a portion of the energy of the acoustic wave, represented by the dashed arrows 140, may leak or escape and propagate across the surface of the substrate. An acoustic wave propagating across the surface of the substrate may reflect at the edges of the substrate. Additionally, since the velocity of an acoustic wave is different between regions of the substrate that are and are not covered by conductors, a portion of the energy of an acoustic wave will reflect each time the acoustic wave encounters the edge of a conductor.

SAW resonators are used in a variety of radio frequency filters including band reject filters, band pass filters, and duplexers. A duplexer is a radio frequency filter device that allows simultaneous transmission in a first frequency band and reception in a second frequency band (different from the first frequency band) using a common antenna. Duplexers are commonly found in radio communications equipment including cellular telephones.

Filter circuits commonly incorporate more than one SAW resonator. For example, FIG. 2 shows a schematic diagram of a filter circuit 200 incorporating nine SAW resonators, labeled Xa through Xi. The use of nine SAW resonators is exemplary and a filter circuit may include more or fewer than nine SAW resonators. The filter circuit 200 may be, for example, a band pass filter, a band reject filter, or a combination band pass/band reject filter depending on the characteristics of the SAW resonators.

The nine SAW resonators Xa through Xi are typically fabricated in close proximity on a common substrate. Since the SAW resonators are in close proximity, acoustic energy that leaks from a first resonator may impinge upon one or more other resonators, either directly or after reflection from an edge of the substrate or an edge of a conductor pattern. The one or more other resonators that receive the leaked acoustic energy may convert some or all of the leaked acoustic energy into electrical signals. For example, acoustic energy leaking from SAW resonator Xa may impinge on SAW resonator Xg, as indicated by the dashed arrow 210, and acoustic energy leaking from SAW resonator Xb may impinge on SAW resonator Xf, as indicated by the dashed arrow 220. Leaked acoustic energy may effectively provide sneak paths by which RF signals can bypass portions of the filter circuit.

FIG. 3 shows a graph 300 comparing the simulated and measured performance of a combination band pass/band reject filter circuit similar to the filter circuit 200 shown in FIG. 2. The graph 300 plots |S(1,2)| (the magnitude in dB of the transfer function between port 1 and port 2 of the filter) as a function of frequency. The solid line 310 is the expected filter performance based on electromagnetic modeling of the filter circuit. The dashed line 320 is the measured performance of a prototype filter. The measured transfer function (dashed line) closely approximates the modeled performance (solid line) over the band pass region centered at 1.785 GHz. The measured transfer function (dashed line) deviates substantially (i.e. as much as 18 dB) from the modeled performance (solid line) over the frequency band from 1.805 GHz to 1.85 GHz. The unexpectedly low insertion loss of the actual filter in this frequency band may result, at least in part, from acoustic leakage paths that are not included in the electromagnetic modeling.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DETAILED DESCRIPTION

Figure 1:
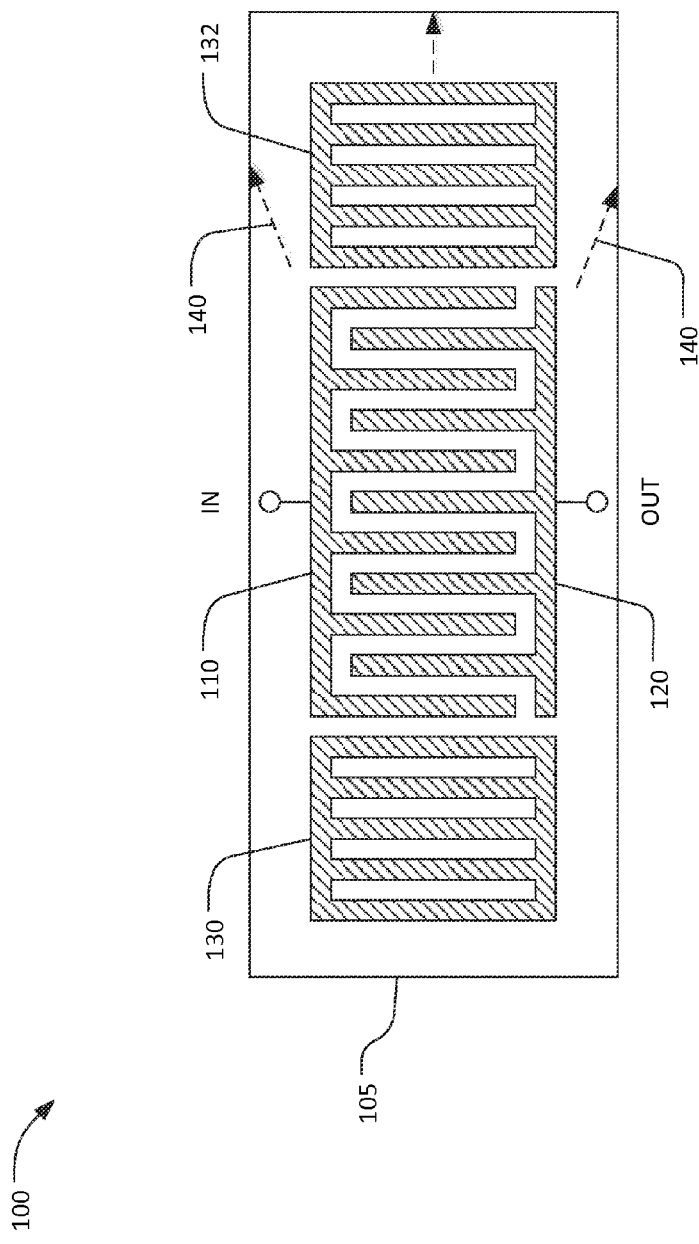
FIG. 1 is a schematic plan view of a SAW resonator.
Figure 2:
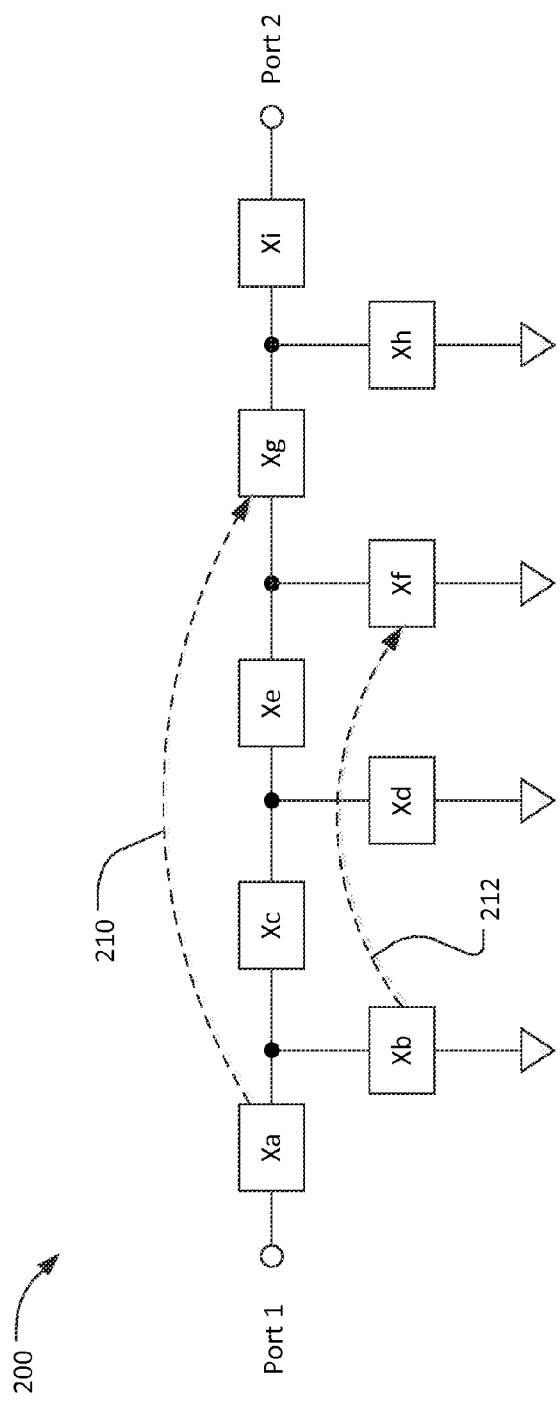
FIG. 2 is a schematic diagram of a filter incorporating multiple SAW resonators.
Figure 3:
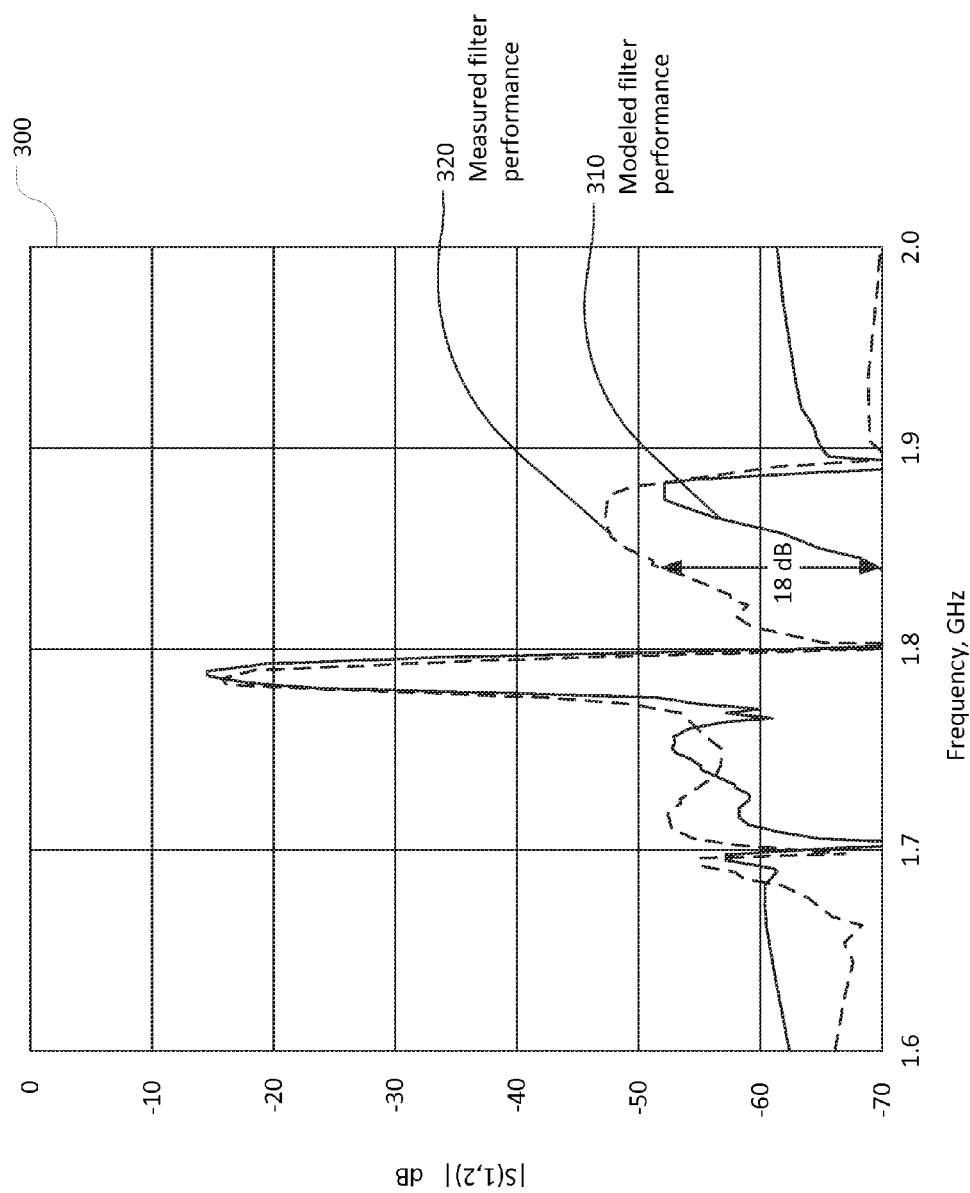
FIG. 3 is a graph comparing modeled and measured performance of a SAW band pass/band reject filter.
Figure 4:
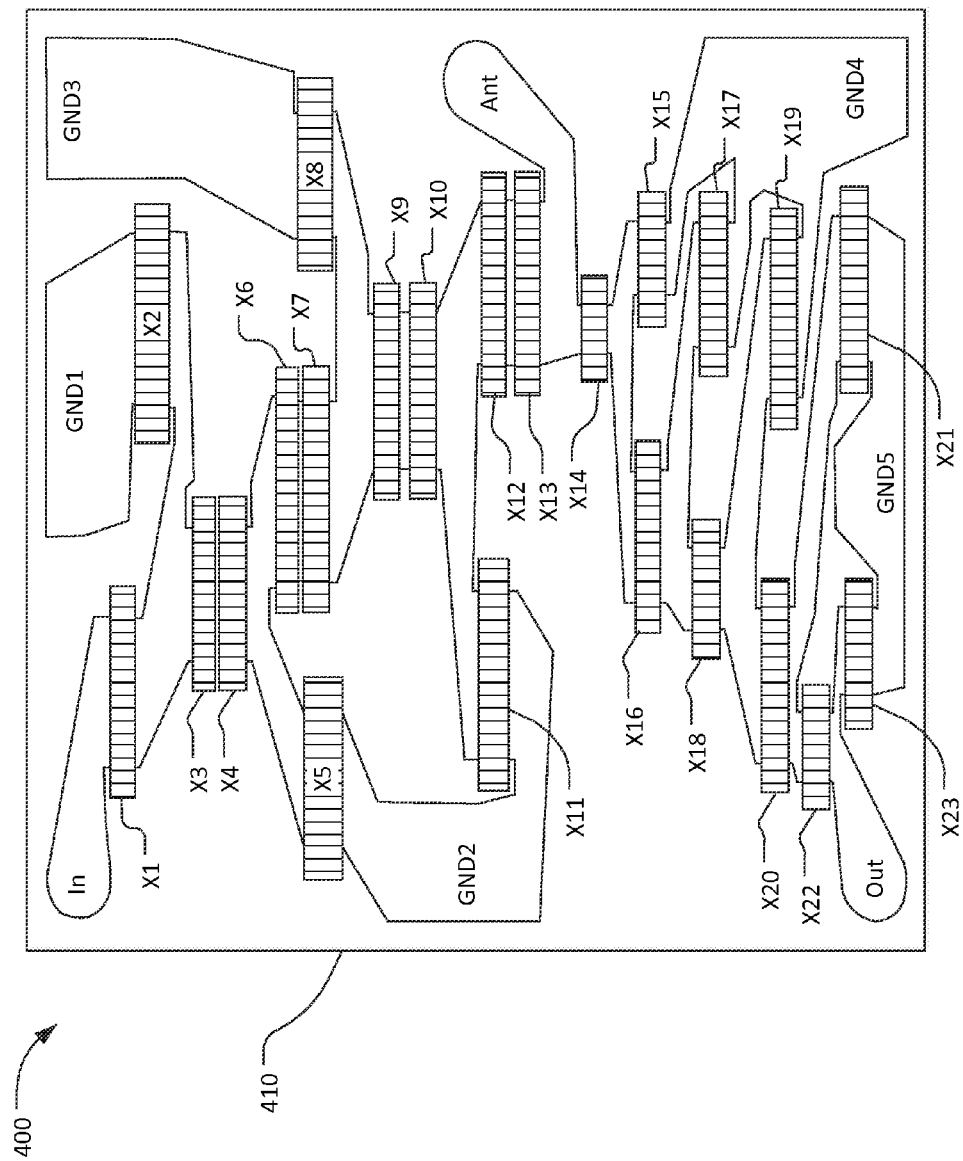
FIG. 4 is a schematic plan view of a duplexer filter incorporating SAW resonators.

FIG. 4 is greatly magnified schematic plan view of a duplexer 400 fabricated by depositing thin film conductors on a piezoelectric substrate 410. Each of the blocks labeled X1 through X23 represents a SAW resonator formed by interdigitated conductors too fine to show in the figure. The frequencies of the resonance and anti-resonance are determined primarily by the pitch and orientation of the interdigitated conductors and the choice of substrate material and its orientation. As is known in the art, each SAW resonator X1-X23 may have a resonance at a first frequency and an anti-resonance at a second frequency.

The twenty-three SAW resonators are interconnected by thin film conductors to form the duplexer circuit. The duplexer 400 includes an input pad, an antenna pad, and an output pad (labeled "in", "ant", and "out", respectively) for connection of bond wires to couple RF signals to/from the duplexer. When the duplexer is incorporated into a device such as a cellular telephone, a transmitter may be connected to the input pad, an antenna may be connected to the antenna pad, and a receiver may be connected to the output pad. The duplexer 400 also includes five ground pads (labeled "GND1" through "GND5") for connection of bond wires to connect the duplexer to an external ground plane.

Figure 5:
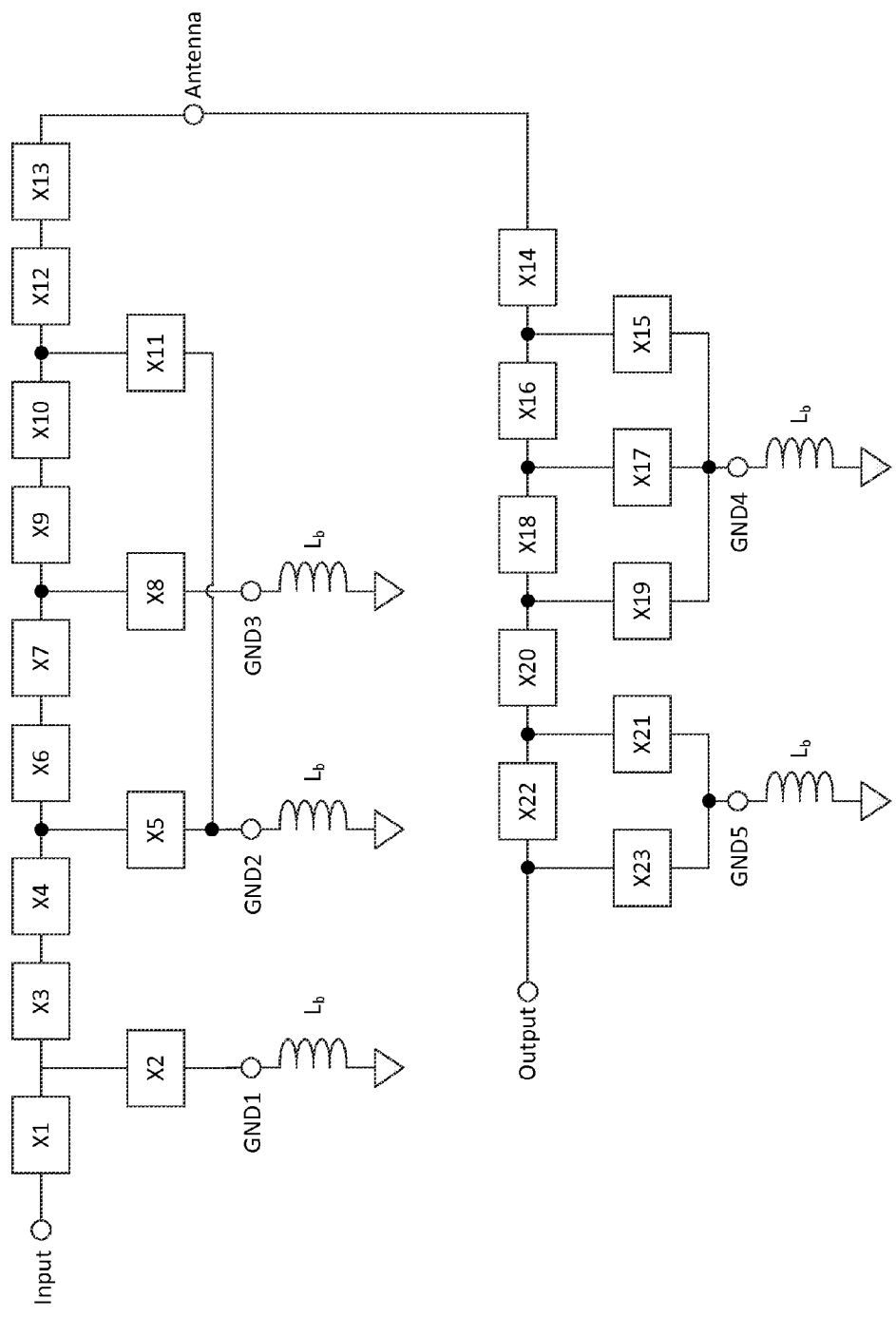
FIG. 5 is a schematic diagram of the duplexer filter of FIG. 4.

FIG. 5 is a schematic circuit diagram of the duplexer 400 shown in FIG. 4. The parasitic inductors $L_b$ are bond wires in series with the ground connections to the duplexer. The duplexer 400 includes a transmit-side filter formed by SAW resonators X1-X13 and a receive-side filter formed by SAW resonators X14-X23. The transmit-side filter is designed to convey RF signals within a transmit frequency band from the transmitter connected to the input pad of the duplexer to the antenna connected to antenna pad, while blocking RF signals in other frequency bands. The receive-side filter is designed to convey RF signals within a receive frequency band from the antenna connected to the antenna pad to a receiver connected to the output pad, while blocking RF signals in other frequency bands.

The RF signal from the transmitter introduced at the input pad may be substantially higher power than the receive signals from the antenna introduced at antenna pad. To prevent leakage of the transmit signal into the input of the receiver connected to output pad, the duplexer 400 may be designed to provide very high isolation between the input pad and the output pad, particular for the receive frequency band, but also for the transmit frequency band.

Figure 6:
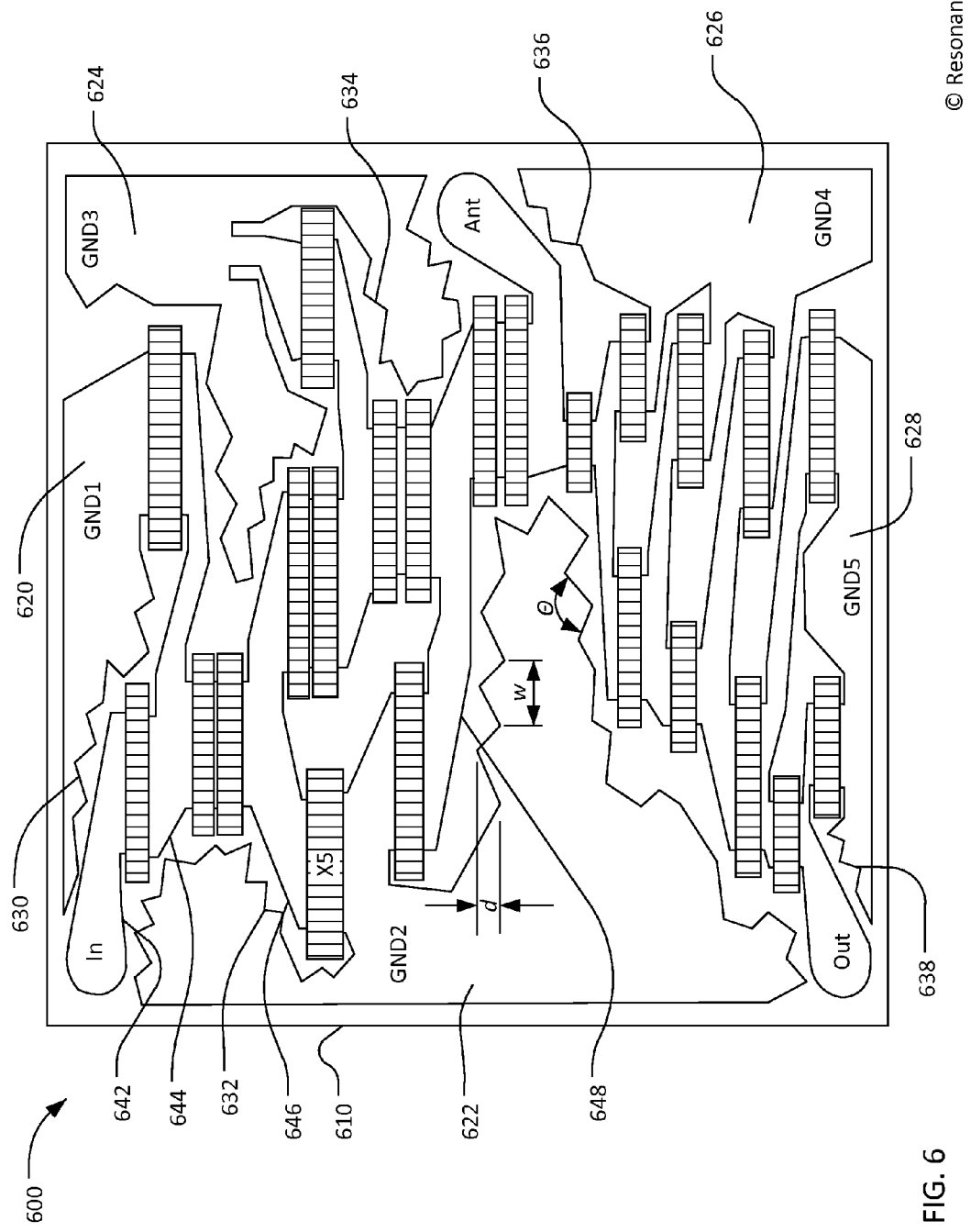
FIG. 6 is a schematic plan view of a duplexer filter incorporating SAW resonators and serrated ground electrodes.

FIG. 6 is greatly magnified schematic plan view of an improved duplexer 600. The improved duplexer has an input pad In, an antenna pad Ant, an output pad Out, and 23 SAW resonators arranged similarly to those of the duplexer 400 of FIG. 4. The input pad, the antenna pad, the output pad, and the SAW resonators are interconnected by signal conductors such as signal conductors 642, 644, 646, and 648. The electrical schematic diagram of the duplexer 600 is essentially the same as shown in FIG. 5. In the duplexer of FIG. 6, ground conductors 620, 622, 624, 626, 628 extend over much of the surface area of the piezoelectric substrate not occupied by the SAW resonators and signal conductors. At least some edges of the ground conductors 620, 622, 624, 626, 628 are serrated, which is to say at least some edges of the ground conductors are formed into plural teeth or serrations, such as serrations 630, 632, 634, 636, 638. The serrated edges of the ground conductors may face one or more of the SAW resonators. All or portions of the serrations along the serrated edges of the ground conductors may face one or more non-serrated signal conductors interconnecting the SAW resonators. For example, ground conductor 622 connects resonator X5 the ground pad GND2 (which is a predetermined region of the ground conductor 622). The ground conductor 622 extends over portions of the substrate 610 not occupied by SAW resonators or signal conductors. Serrations along the edges of the ground conductor 622 face non-serrated signal conductors 642, 644, 646, and 648.

The serrations along the edges of the ground conductors may be triangular, as shown in FIG. 6. Some or all of the serrations may be or include convex curved portions, concave curved portions, or combinations of straight, convex, and/or concave portions. Curved portions may be circular, parabolic, sinusoidal, or some other shape.

The multiple serrations along at least some edges of the ground conductors are not necessarily uniform in size or shape. In the case of triangular serrations, the width w, depth d, and internal angle Θ of the serrations may vary. The width w and depth d of the serrations may be large compared to the wavelength of the acoustic waves propagating on the surface of the substrate. For example, the width w and depth d of each serration may be between 10 microns and 100 microns. The internal angle Θ of each serration may be from 45 degrees to 135 degrees. Serrations such as serrations 630, 632, 634, 636, 638 may scatter acoustic waves to reduce undesired acoustic coupling between SAW resonators. Triangular serrations having an internal angle Θ near 90 degrees may function to retro-reflect at least a portion of incident acoustic waves.

Figure 7:
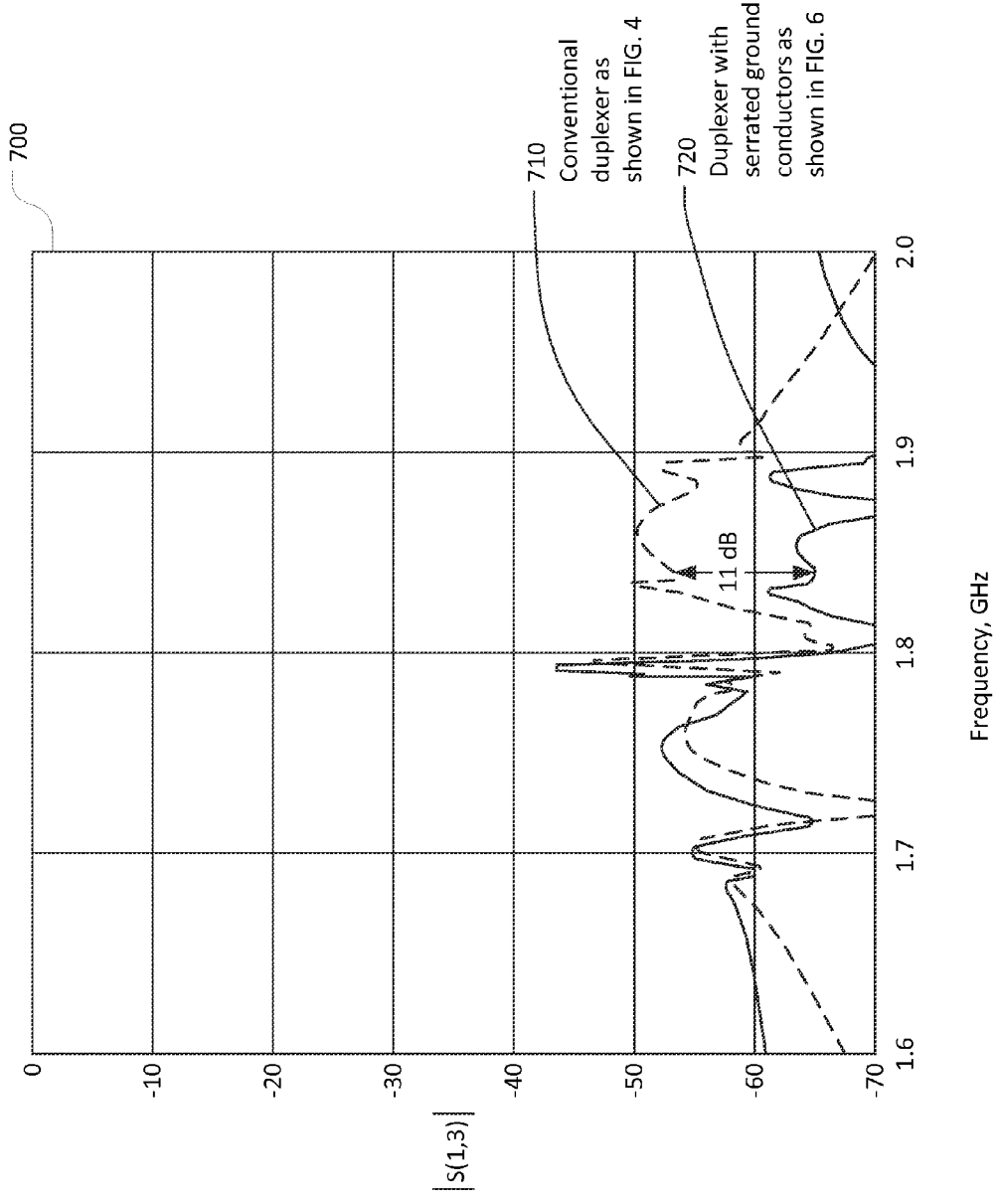
FIG. 7 is a graph comparing measured performance of the duplexer of FIG. 4 and the duplexer of FIG. 6.

FIG. 7 shows a graph 700 comparing the |S(1,3)| parameter for the conventional duplexer of FIG. 4 (dashed curve) and the improved duplexer of FIG. 6 (solid curve). The |S(1,3)| parameter is the magnitude of the coupling between the input pad and the output pad of the duplexer. The improved duplexer of FIG. 6 provides about 10 dB to 15 dB lower coupling (i.e. 10 dB to 15 dB greater isolation) between port 1 and port 3 over the frequency range from 1.805 to 1.88 GHz.

While the example of FIG. 6 and FIG. 7 shows the effectiveness of serrated ground conductors to improve isolation in a duplexer, serrated ground conductors may also be employed to reduce undesired acoustic coupling between SAW resonators to increase rejection in band reject filters.

It is claimed:

1. A filter device, comprising:
   two or more surface acoustic wave resonators formed on a surface of a substrate; and
   at least one ground conductor formed on the surface of the substrate, at least a portion of an edge of the conductor shaped as a plurality of serrations, at least some of the serrations facing one or more non-serrated signal conductors.

2. The filter device of claim 1, wherein the plurality of serrations are configured to scatter incident surface acoustic waves to reduce acoustic coupling between at least some of the two or more surface acoustic wave resonators.

3. The filter device of claim 1, wherein one or more of the plurality of serrations are triangular.

4. The filter device of claim 3, wherein each triangular serration has a depth, a width, and an included angle.

5. The filter device of claim 4, wherein at least some of the triangular serrations have respective depths and widths that are larger than wavelengths of surface acoustic waves generated by the one or more surface acoustic wave resonators.

6. The filter device of claim 4, wherein at least some of the triangular serrations have respective depths and widths between 10 and 100 microns.

7. The filter device of claim 4, wherein at least some of the triangular serrations have respective internal angles between 45 and 135 degrees.

8. The filter device of claim 1, wherein the filter device is a band-reject filter.

9. The filter device of claim 1, wherein the filter device is a duplexer.

10. A filter device, comprising:
a substrate having a surface;
an input pad, and output pad, and at least one ground pad formed on the surface;
a filter circuit coupled between the input pad and the output pad, the filter circuit including two or more surface acoustic wave resonators formed on the surface; and
at least one ground conductor formed on the surface of the substrate and coupled to the at least one ground pad, at least a portion of an edge of the ground conductor shaped as a plurality of serrations, at least some of the serrations facing one or more non-serrated signal conductors.

11. The filter device of claim 10, wherein the plurality of serrations are configured to scatter incident surface acoustic waves to reduce acoustic coupling between at least some of the two or more surface acoustic wave resonators.

12. The filter device of claim 10, wherein the plurality of serrations are configured to increase an insertion loss between the input pad and the output pad over a predetermined frequency band.

13. The filter device of claim 10, wherein one or more of the plurality of serrations are triangular.

14. The filter device of claim 13, wherein each triangular serration has a depth, a width, and an included angle.

15. The filter device of claim 14, wherein at least some of the triangular serrations have respective depths and widths that are larger than a wavelength of the surface acoustic waves generated by any of the one or more surface acoustic wave resonators.

16. The filter device of claim 14, wherein at least some of the triangular serrations have respective depths and widths between 10 and 100 microns.

17. The filter device of claim 14, wherein at least some of the triangular serrations have respective internal angles between 45 and 135 degrees.

18. The filter device of claim 10, wherein the filter is a band-reject filter.

19. The filter device of claim 10, further comprising:
an antenna pad, wherein
the filter circuit comprises a receive filter circuit coupled between the input pad and the antenna pad and a transmit filter circuit coupled between the antenna pad and the output pad.

20. The filter device of claim 19, wherein the filter device is a duplexer.

* * * * *